United States Patent
Wang et al.

(10) Patent No.: US 7,009,846 B1
(45) Date of Patent: Mar. 7, 2006

(54) 13-PIN SOCKET FOR COMBINATION SD/MMC FLASH MEMORY SYSTEM

(75) Inventors: Kuang-Yu Wang, Saratoga, CA (US); Jim Ni, San Jose, CA (US); I-Kang Yu, Palo Alto, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 10/903,939

(22) Filed: Jul. 30, 2004

(51) Int. Cl.
H05K 7/02 (2006.01)

(52) U.S. Cl. ............ 361/737; 361/752; 439/945; 235/492

(58) Field of Classification Search ............ 361/737, 361/760; 235/492, 487; 439/328, 357, 945
See application file for complete search history.

(56) References Cited

U.S. PATENT DOCUMENTS

| | | | |
|---|---|---|---|
| 5,563,769 A | 10/1996 | MacGregor | |
| 5,891,483 A | 4/1999 | Miyajima | |
| 6,040,622 A | 3/2000 | Wallace | |
| 6,102,743 A | 8/2000 | Haffenden et al. | |
| 6,166,913 A | 12/2000 | Fun et al. | |
| D445,096 S | 7/2001 | Wallace | |
| D452,690 S | 1/2002 | Wallace et al. | |
| D452,865 S | 1/2002 | Wallace et al. | |
| D453,934 S | 2/2002 | Wallace et al. | |
| 6,381,143 B1 | 4/2002 | Nakamura | |
| 6,386,920 B1 * | 5/2002 | Sun | 439/630 |
| 6,399,906 B1 | 6/2002 | Sato et al. | |
| 6,410,355 B1 | 6/2002 | Wallace | |
| 6,462,273 B1 | 10/2002 | Corisis et al. | |
| 6,527,188 B1 | 3/2003 | Shobara et al. | |
| 6,624,005 B1 | 9/2003 | DiCaprio et al. | |
| 6,634,561 B1 | 10/2003 | Wallace | |
| 6,700,788 B1 * | 3/2004 | Matsushita et al. | 361/737 |
| 6,746,280 B1 * | 6/2004 | Lu et al. | 439/630 |
| 2004/0070952 A1 * | 4/2004 | Higuchi et al. | 361/737 |
| 2004/0084538 A1 * | 5/2004 | Nishizawa et al. | 235/492 |

* cited by examiner

Primary Examiner—Kamand Cuneo
Assistant Examiner—Dameon E. Levi
(74) Attorney, Agent, or Firm—Bever, Hoffman & Harms, LLP; Patrick T. Bever

(57) ABSTRACT

A socket having thirteen contact springs arranged in a manner that supports existing MMC and SD form factors, and also supports a combination SD/MMC flash memory card. The combination memory card includes a PCB assembly that is consistent with existing 13-pad MMC mechanical form factors, and a housing that is consistent with the SD mechanical form factor, thereby providing a single PCBA and housing arrangement that can be used to produce both MMC and SD memory cards. The thirteen contact pads support all MMC and SD contact pad patterns, but are modified to facilitate a write protect switch. The contacts springs of the socket are arranged to make contact with the modified pad pattern, but to also be backward compatible with existing SD and MMC form factors. A system including the socket and combination SD/MMC flash memory card is also disclosed.

21 Claims, 9 Drawing Sheets

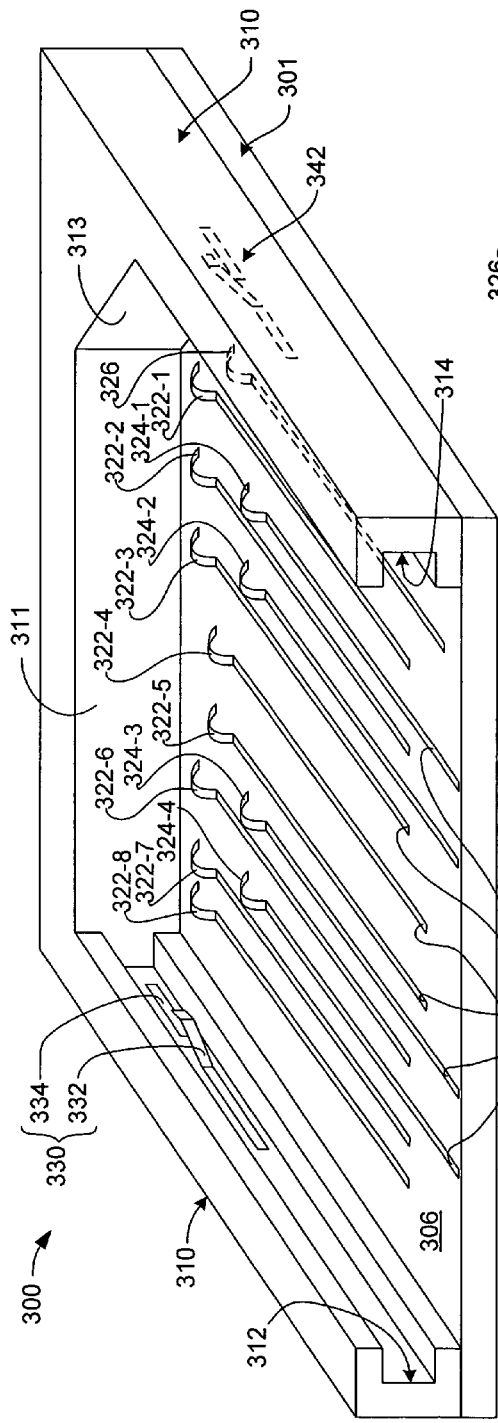
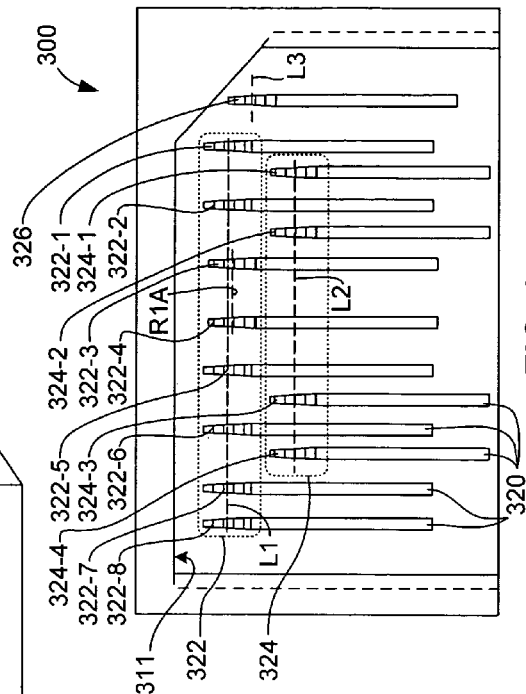
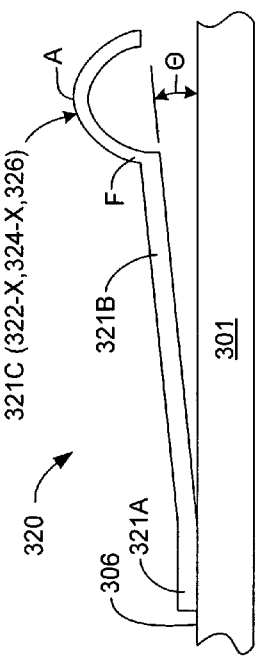
FIG. 1
FIG. 3
FIG. 2

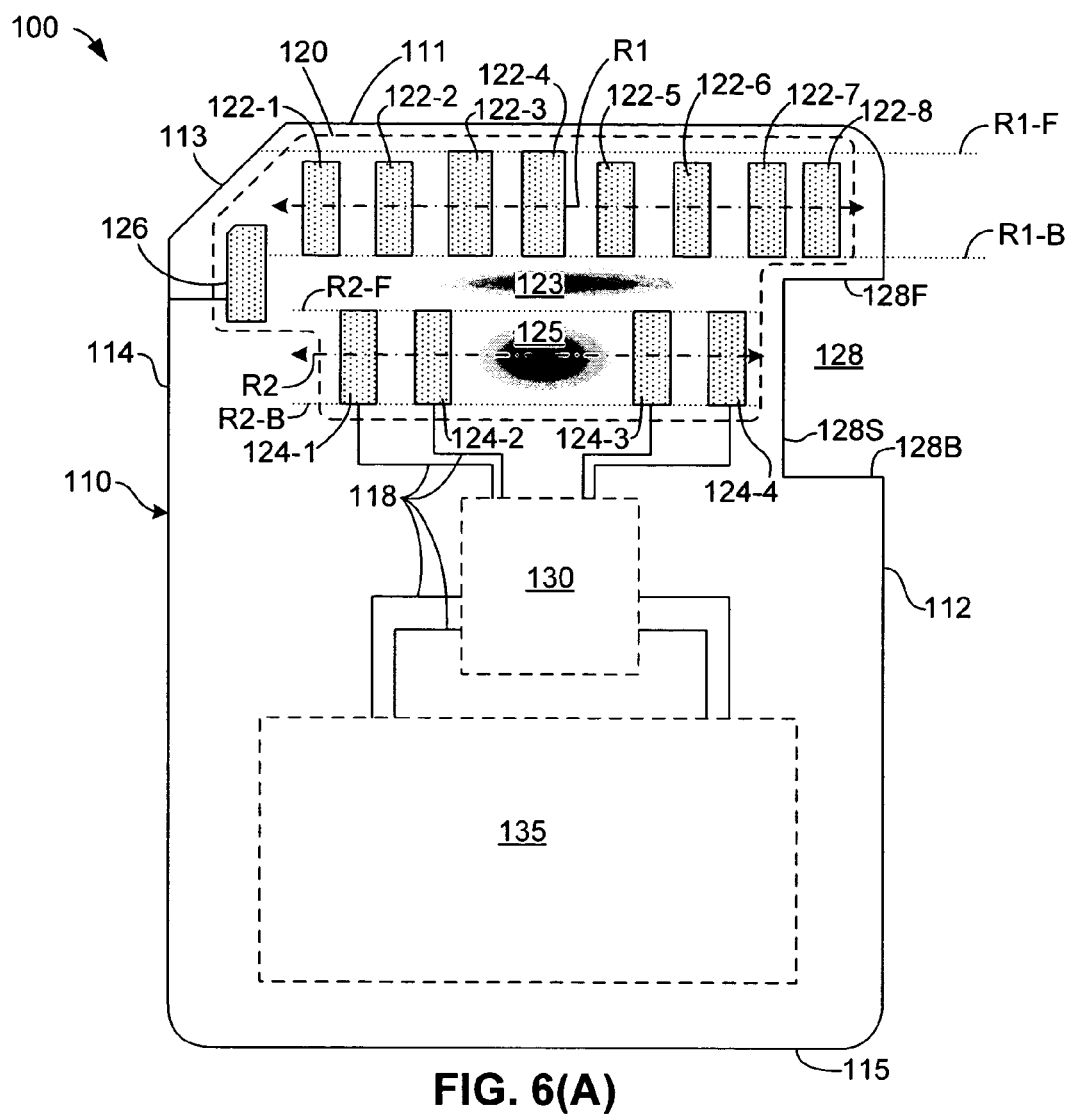
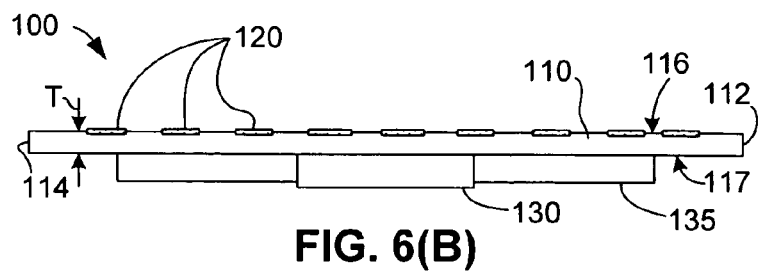
FIG. 6(A)
FIG. 6(B)

13-PIN SOCKET FOR COMBINATION SD/MMC FLASH MEMORY SYSTEM

BACKGROUND OF THE INVENTION

1. Field of the Invention

This invention relates to memory card systems, and more particularly to removable memory card sockets for dual-protocol memory card systems.

2. Related Art

Flash-memory cards are widely used for storing digital pictures captured by digital cameras. One useful format is the Secure-Digital (SD) format, which is an extension of the earlier MultiMediaCard (MMC) format. Such memory cards are also useful as add-on memory cards for other devices, such as portable music players, personal digital assistants (PDAs), and even notebook computers. SD cards are hot-swappable, allowing the user to easily insert and remove SD cards without rebooting or cycling power. Since the SD cards are small, durable, and removable, data files can easily be transported among electronic devices by being copied to an SD card. SD cards are not limited to flash-memory cards, but other applications such as communications transceivers can be implemented as SD cards.

SD and MMC are complementary card interfaces, and are sometimes lumped together and referred to as SD/MMC cards. Both SD and MMC cards are thin and the area they occupy is about that of a large postage stamp. Older "7-pad" MMC cards have 7 metal connector pads, while SD cards have 9 connector pads. MMC cards can fit in SD slots, but SD cards, which are packaged in about 50% thicker housings, cannot fit in MMC slots. In memory card systems that accept either SD or MMC cards, the host socket must be sized to accept both card types, and also must have an operating system capable of determining which type of card is inserted into its socket, and capable of transmitting the necessary communication protocol needed to communicate with the inserted card. When a 7-pad MMC card is inserted, only seven contact pins of the socket are used for communication, while the additional two socket pins are used when a 9-pad SD card are detected in the slot.

The 9-pad SD interface currently supports a top transfer rate of 100 Mb/s, which is sufficient for many applications. However, some applications such as storage and transport of full-motion video could benefit from higher transfer rates. One limitation to the 9-pad form factor is that data is transferred in a parallel x4-bit manner (i.e., four bits per transmission cycle).

One method to improve transmission speeds for SD and MMC cards is to facilitate x8-bit data transmission by increasing the number of contact pads to thirteen. MMC recently announced its Specification Version 4.0, which introduced a two-row, thirteen contact pad arrangement and associated electronics. While the 13-pad arrangement introduced in the MMC 4.0 specification is generally backward compatible to earlier MMC and SD cards, the arrangement calls out enlarged contact areas that preclude the formation of a write protect switch utilized in SD cards. Further, the socket proposed for use with MMC Specification Version 4.0 memory cards utilizes contact springs that are inconsistent with some contact pad locations associated with 9-pad SD memory cards. That is, while the pin configuration of the MMC 4.0 sockets allows backward compatibility with 7-pad MMC cards, it is not compatible with 9-pad Secure Digital (SD) cards. Accordingly, the MMC Specification Version 4.0 cannot be used in memory card systems that communicate with both SD and MMC card form factors, and a separate socket structure is needed to receive and read MMC and SD memory cards.

What is needed is a 13-pin memory card socket apparatus that can receive existing 7-pad MMC cards, 9-pad SD cards, 13-pad MMC devices, thereby facilitating an integrated SD/MMC system. What is also needed is a combination SD/MMC memory card that can be configured to produce any MMC or SD form factor, and can be efficiently combined with the socket apparatus to provide a low cost, highly versatile integrated SD/MMC system.

SUMMARY OF THE INVENTION

The present invention is directed to a 13-pin memory card socket that is configured to receive/read both MMC and SD cards, and thereby facilitating an integrated SD/MMC system. In particular, the socket includes contact springs arranged in a pattern that is consistent with (i.e., positioned to operably connect with) the contact pad locations found on 7-pad MMC cards, 9-pad SD cards, and 13-pad MMC devices, as well as a newly-proposed 13-pad SD card. The socket also includes a write-protect detector for detecting the write protection switch utilized by existing SD form factors. Accordingly, the 13-pin memory card socket provides a single socket apparatus that can be utilized in a wide range of electronic devices to read either MMC or SD memory cards, thereby increasing the versatility of such devices, and reducing manufacturing costs by allowing a single production line to produce sockets for both MMC and SD applications.

According to an embodiment of the present invention, the socket includes a circuit board, a frame mounted over a surface of the circuit board, and an array of contact springs mounted on the circuit board surface. The frame defines parallel slots for slidably receiving side edges of an inserted memory card, an end wall positioned to abut the front edge of the memory card when fully inserted into the socket, and a chamfer wall extending between the front wall and one of the side walls. A write protect detection structure is mounted in one of the slots for detecting a position (i.e., write enabled or write disabled) of the write-protect switch. Each of the contact springs includes a base connected to the circuit board, an inclined section extending at a shallow angle away from the circuit board, and a hook structure mounted at the free end of the inclined section. Each hook forms an arch having a fixed end connected to a corresponding inclined section, and is aligned perpendicular to the circuit board surface such that an apex of the arch is positioned further from the circuit board surface than the fixed end. Each hook is biased away from the circuit board surface by its corresponding inclined section, and the contact springs are positioned such that each hook contacts either a contact pad or a non-conducting surface of the inserted memory card.

According to an aspect of the present invention, the contact springs are arranged on the circuit board such that the corresponding hooks define two rows: a front (first) row including eight hooks that are arranged to contact the eight front pads of a 13-pad memory card, and a second (back) row including four hooks that are arranged to contact the four back pads of a 13-pad memory card. A thirteenth contact spring is located at one end of the circuit board adjacent to the chamfer wall, and is arranged such that the apex of its hook is located between the front and back rows, and positioned to make contact with the offset (e.g., "C8") contact pad of the memory card. Two central contact springs of the front row are slightly offset to make contact with power and ground pads of the inserted memory card before the remaining contact springs contact the data pads of the memory card.

According to another embodiment of the present invention, an integrated SD/MMC host system includes both the socket apparatus (described above) and a combination 13-pad SD/MMC flash memory card that can be utilized to emulate any existing SD or MMC form factor, and may also be used to produce 13-pad SD memory cards. Each combination SD/MMC memory card includes a printed circuit board assembly (PCBA) that is consistent with existing 13-pad MMC mechanical form factors, and a housing that is consistent with the SD mechanical form factor. In particular, the PCBA includes thirteen contact pads arranged in a pattern consistent with MMC Specification Version 4.0 mechanical form factors, and the housing includes both upper and lower covers that mount over the upper and lower surfaces of the PCBA. By packaging the MMC-compliant PCBA in the SD-type housing in the manner described herein, and by utilizing the 13-pin socket apparatus also described herein, an efficient integrated SD/MMC host system is provided that recognizes and communicates with memory cards operating on either SD or MMC electronic protocols, and supports any existing form factor. The present invention also facilitates the inexpensive production of SD and/or MMC memory cards for the integrated SD/MMC host system because the PCBA and housing assembly can be utilized to produce cards of both types, and the socket is predisposed to function with either of these form factors (as well as being backward compatible with existing MMC and SD form factors).

The invention will be more fully understood in view of the following description of the exemplary embodiments and the drawings thereof.

BRIEF DESCRIPTION OF THE DRAWINGS

FIG. 1 is a socket apparatus according to an embodiment of the present invention.

FIG. 2 is a side view showing a contact spring utilized by the socket apparatus of FIG. 1.

FIG. 3 is a top view showing the socket apparatus of FIG. 1.

FIGS. 6(A) and 6(B) are top plan views showing printed circuit board assemblies (PCBAs) having two rows of contact pads according to an embodiment of the present invention.

DETAILED DESCRIPTION

Figure 4:
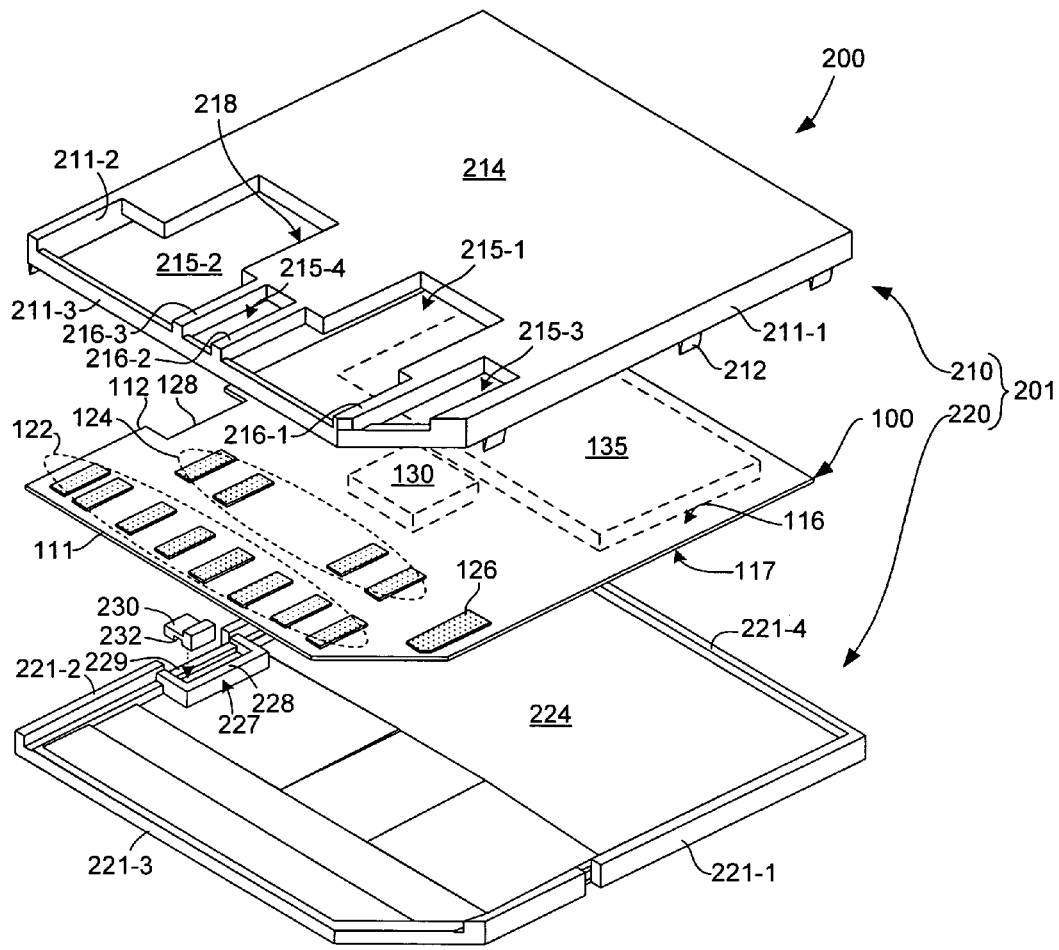
FIG. 4 is an exploded perspective view showing a combination SD/MMC memory card according to an embodiment of the present invention.

FIG. 1 is a perspective view showing a socket apparatus 300 according to an embodiment of the present invention. Socket apparatus 300 includes a circuit board 301 having a surface 306, and a frame 310 positioned over the circuit board surface and defining parallel slots 312 and 314 for slidably receiving a memory card (discussed below). Frame 310 also includes an end wall 311 positioned to abut the front edge of the memory card when the memory card is fully inserted into socket apparatus 300, and a chamfer wall 313 extending between front wall 311 and slot 314 at the predetermined angle that matches a similar feature of the memory card. Thirteen contact springs 320 are mounted on surface 306 of circuit board 301, each contact spring being arranged to contact corresponding structures of the inserted memory card in the manner described below. A write-protect detection structure 330, which includes a movable electrode 332 and a fixed electrode 334, is mounted in slot 312 for detecting a position of a write-protect switch of the inserted memory card in the manner described below. A card detection electrode 342, which is similar to write-protection structure 330, is mounted in slot 314 for detecting the existence of a memory card when the memory card is in full engagement position inside the socket.

Referring to FIG. 2, according to an aspect of the present invention, each contact spring 320 includes a base 321A attached to surface 306 of circuit board 301, an inclined section 321B extending at a shallow angle θ away from circuit board 301, and a hook 321C mounted at the free end of inclined section 321B, where physical and electrical contacts occur. Each hook is identified by a unique hook reference number 322-X, 324-X or 326, which is assigned based on its position. For example, referring to FIG. 1, the left-most hook is identified as hook 322-8 due to its position relative to the other hooks, as described below. Each hook 321C is in the form of a generally semi-circular arch having a fixed end F connected to its corresponding inclined section 321B, and defines a plane that is aligned perpendicular to surface 306 (e.g., in the plane of the sheet associated with FIG. 2) such that an apex A of the arch is positioned further from surface 306 than any other part of the arch (e.g., further than fixed end F). Contact springs 320 are constructed such that each hook 321C is resiliently biased away from surface 306 by its corresponding inclined section 321B. As described below, the arch shape of hook 321C facilitates both sliding along the various surfaces of a memory card during both insertion and withdrawal, and contact with a corresponding contact pad of the inserted memory card.

Referring to FIGS. 1 and 3, according to an aspect of the present invention, contact springs 320 are arranged on circuit board 301 such that the corresponding hooks define two rows: a front (first) row 322 including eight hooks 322-1 through 322-8 that are aligned parallel to front wall 311 of frame 310 and positioned to contact a first row of contact pads of an inserted memory card, and a second (back) row 324 including four hooks 324-1 through 324-4 that are arranged parallel to front row 322 and spaced in a manner such that they contact four back contact pads of an inserted 13-pad memory card. As indicated in FIG. 2, the apexes of hooks 322-1 through 322-8 generally define a straight line L1 that extend parallel to front wall 311, and the apexes of hooks 324-1 through 324-4 define a straight line L2 that extends parallel to line L1. In addition, a thirteenth contact spring including a thirteenth hook 326 is located at one end of circuit board 301 adjacent to chamfer wall 313, and is arranged such that the apex of hook 326 lies on a third line L3 located between the rows 322 and 324 (i.e. between parallel lines L1 and L2). Note that, in one embodiment, two hooks 322-3 and 322-4 are slightly offset toward second row 324 for reasons that will become clear below.

In accordance with another embodiment of the present invention, socket 300 may be utilized in conjunction with a combination SD/MMC memory card to provide a single, highly versatile system that can be used in a variety of devices and applications. One such combination SD/MMC memory card is introduced below with reference to FIGS. 4 through 6(B). Additional features and aspects associated with combination SD/MMC memory cards are disclosed in co-owned and co-pending U.S. patent application Ser. No. 10/871,741, filed Jun. 18, 2004, entitled "COMBINATION SD/MMC FLASH MEMORY CARD WITH THIRTEEN CONTACT PADS", which is incorporated herein by reference in its entirety.

Figure 5:
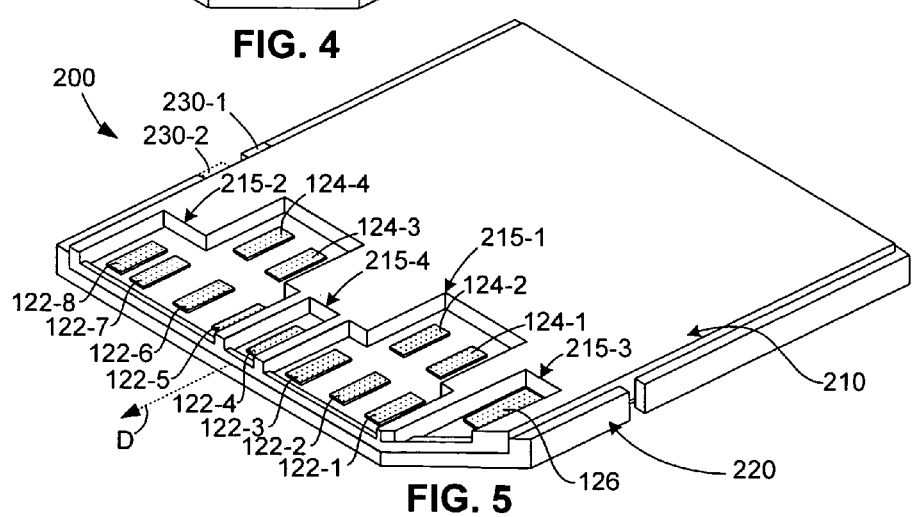
FIG. 5 is an assembled perspective view showing the memory card of FIG. 4.

FIGS. 4 and 5 are exploded perspective and assembled perspective views, respectively, showing an exemplary 13-pad combination SD/MMC memory card 200 according to an embodiment of the present invention. Memory card 200 generally includes a printed circuit board assembly (PCBA) 100 and a two-part housing 201 including an upper cover 210 and a lower cover 220 that are mounted over PCBA 100 in the manner shown in FIG. 5.

According to an aspect of the present invention, PCBA 100 is constructed in a manner that is consistent with MMC Specification Version 4.0 mechanical form factors, which were announced by MultiMediaCard (MMC) Association (www.mmca.org) in February 2004, and housing 201 is constructed in a manner that is consistent with mechanical form factors established by SD Card Association (www.sd-card.org). In particular, PCBA 100 includes thirteen contact pads arranged in a pattern consistent with MMC Specification Version 4.0, and housing 201 is formed with dimensions that comply with the SD form factor. By packaging PCBA 100 in SD-type housing 201 in the manner described below, the present invention facilitates an efficient integrated SD/MMC host system that recognizes and communicates with memory cards operating on either SD or MMC electronic protocols. In addition, the present invention also facilitates the inexpensive production of both SD and/or MMC memory cards for the integrated SD/MMC host system because the PCBA can be utilized to produce cards of both types.

Referring to FIG. 4, PCBA 100 includes a printed circuit board (PCB) 101 having thirteen contact pads formed on an upper surface 116 thereof, and one or more integrated circuits (ICs) 130 and 135 (indicated by dashed lines) mounted on a lower surface 117 thereof. As described in additional detail below, the thirteen contact pads are formed in an arrangement that is consistent with the MMC Specification Version 4.0 mechanical form factor. For explanatory purposes, the thirteen contact pads are generally designated as a first group 122 including eight contact pads (designated 122-1 through 122-8 in FIG. 5) aligned along a front edge 111 of PCB 101, a second group 124 including four contact pads (designated 124-1 through 124-4 in FIG. 5) arranged behind first group 122, and a thirteenth contact pad 126. As discussed in further detail below, although PCBA 100 is constructed in compliance with the MMC mechanical form factor (which is consistent with the 9-pad SD mechanical form factor), ICs 130 and 135 may be fabricated in accordance with either the SD or MMC communication protocols, thereby providing a single memory card structure that can be used to produce either SD or MMC memory cards.

FIGS. 6(A) and 6(B) are top plan and end elevation views showing PCBA 100 in additional detail. PCBA 100 generally includes a printed circuit board 110 having a contact pad array 120 formed on its upper surface, and integrated circuits (ICs) 130 and 135 mounted on its lower surface. PCB 110 is formed in accordance with known PCB manufacturing techniques such that the contact pads of array 120 and ICs 130 and 135 (as well as other circuit components, which are omitted for brevity) are electrically interconnected by a predefined network of conductive traces 118 (only a few of which are shown for illustrative purposes).

According to both the MMC and SD mechanical form factors, PCB 110 is a substantially rectangular, flat substrate including multiple layers of conductive traces 118 and other conducting structures sandwiched between multiple layers of an insulating material (e.g., FR4) and adhesive. PCB 110 includes a front edge 111, a relatively long side edge 112, a relatively short side edge 114 located opposite to relatively long side edge 112, and a back edge 115. A chamfer (angled) edge 113 extends at approximately 45° between front edge 111 and shorter side edge 114. In one embodiment, PCB 110 has a length (i.e., measured from front edge 111 to back edge 115) designed to fit in a housing that is 32 mm in length, a width (measured from longer side edge 112 to shorter side edge 114) designed to fit in the same housing that is 24 mm in width, and has a thickness T (measured from lower surface 116 to upper surface 117, as shown in FIG. 6(B)) of approximately 0.3 mm.

Referring to FIG. 6(A), contact pad array 120 includes first contact pad group 122 arranged to form a first row R1 that is parallel to front edge 111, second group 124 arranged to form a second row R2 that is parallel to first row R1, and thirteenth contact pad 126 that spans the first and second rows and is located adjacent to chamfer edge 113. First group 122 includes a first contact pad 122-1 that is located adjacent to an intersection of front edge 111 and chamfer edge 113, an eighth contact pad 122-8 that is located adjacent to longer side edge 112, and six intermediate contact pads 122-2, 122-3, 122-4, 122-5, 122-6 and 122-7 respectively arranged between first contact pad 122-1 and eighth contact pad 122-8. In one embodiment, contact pads 122-1, 122-2 and 122-5 through 122-8 define rectangular regions (elongated bodies) that are approximately 5 mm in length and 1.3 mm in width and contact pads 122-3 and 122-4 define slightly larger regions that are approximately 5.3 mm in length and approximately 1.7 mm in width. The majority of pads 124-1, 124-2, 124-3 and 124-4 should be able to fit into the space defined laterally by the edges between pads 122-1 and 122-2, 122-2 and 122-3, 122-5 and 122-6, and 122-6 and 122-7, respectively. The front ends of contact pads 122-1 through 122-8 (i.e., the ends closest to front edge 111) define a front end R1-F of first row R1, and the back ends of contact pads 122-1 through 122-8 (i.e., the ends furthest from front edge 111) define a back end R1-B of first row R1. Similarly, contact pads 124-1 through 124-4 of second row R2 define rectangular regions that are approximately 5 mm in length and 1.3 mm in width, the front ends of contact pads 124-1 through 124-4 define a front end R2-F of second row R2, and the back ends of contact pads 124-1 through 124-4 define a back end R2-B of second row R2. Respective spacings between adjacent contact pads of the first and second groups are approximately 1.5 mm (on average). Note that (ninth) contact pads 124-1 and (tenth) contact pad 124-2 form a first subgroup of second row R2, and (eleventh) contact pad 124-3 and (twelfth) contact pad 124-4 form a second subgroup of second row R2 that is spaced from the first subgroup by a relatively wide central gap 125 (i.e., approximately 6.6 mm). Note that the lengthwise (longitudinal) direction of all of the contact pads of array 120 is substantially perpendicular to front edge 111 of PCB 110.

The PCB form factor and arrangement of contact pads of array 120 provide a substantial improvement over existing memory card specifications because array 120 facilitates the production of both SD and MMC memory cards, thereby facilitating the electronic system (described below) that accepts and reads both MMC and SD memory cards. In addition, array 120 facilitates the production of 13-pad MMC memory cards that utilize existing SD write protection apparatus to protect information written thereon, which is not possible using existing 13-pad MMC card form factors.

MultiMediaCard (MMC) Association (www.mmca.org) announced Specification Version 4.0 in February 2004 including a 13-pad arrangement. MMC Specification Version 4.0 features wider bus-width (x1 bit, x4 bit, or x8 bit), higher clock frequency with up to 20× faster transfer speed, and dual voltage operation enabling applications at lower power consumption by small mobile devices. Like PCBA 100, a memory card complying with MMC Specification version 4.0 includes thirteen metal contact pads (designated C1 through C13) formed in two rows on a PCB (substrate). The PCB of the MMC 4.0 specification is essentially identical to the form factor (i.e., length, width, thickness) described above with respect to PCB 110. The location of the contact pads according to the MMC 4.0 specification allows the card remains compatible with the older version MMC card standard (3.X) while providing additional contact pads in the second row to facilitate x8 bit transmissions. For example, the 13 metal contact pads of the MMC 4.0 specification allow the memory card to communicate with a host device in "8 bit" set up for I/O transmission.

The specific positioning, shape and size of the thirteen contact pads associated with MMC Specification Version 4.0 is similar to the contact pad arrangement of array 120, with two notable differences. That is, the placement, size, and spacing of contact pads 122-1 through 122-7 and 124-1 through 124-4 of array 120 (shown in FIG. 6(A)) are essentially identical to corresponding contact pads of the Specification Version 4.0 (i.e., contact pads C1–C7 and C10–C13). In addition, eighth contact pad 122-8 and thirteenth contact pad 126 of array 120 correspond to portions of contact pads C8 and C9, respectively, of the MMC Specification Version 4.0 arrangement. However, contact pads C8 and C9 include extended body sections that are not utilized in contact pads 122-8 and 126 of array 120. In particular, a leading section of contact pad C8 (i.e., the portion generally aligned with the first contact pad row) corresponds to eighth contact pad 122-8, but contact pad C8 also includes a rear section that extends from the back end of the first (front) row to the back end of the second row. In addition, a leading section of contact pad C9 corresponds to thirteenth contact pad 126, but contact pad C9 also includes a rear section that extends from the back end of the leading section to the back end of the second row.

The present inventors have determined that only the leading portion of contact pads C8 and C9 of the MMC Specification Version 4.0 arrangement are necessary and desirable to facilitate access using a socket that is configured to access both MMC and SD memory cards. That is, for a system to accept and read both SD and MMC memory cards, the system would require a socket that (a) has a sufficiently large opening to accept the thicker SD form factor, (b) have contact pins capable of electrically connecting to the various pin arrangements provided on the SD and MMC memory cards, and (c) have a write protect detector positioned to detect the position of a write protect switch located on the longer side edge of standard SD housing. Taking advantage of requirement (a) (i.e., a socket large enough to accept SD memory cards), the present inventors propose an MMC memory card (described below) that is packaged in a housing based on the thicker SD form factor, although the thinner MMC form factor would certainly fit within such a socket. However, in meeting requirements (b) and (c), the present inventors have determined that the rear portions of contact pads C8 and C9 are undesirable because these portions are not consistent with the earlier form factors, because these portions unnecessarily take up valuable PCB surface area, and because the rear portion of contact pad C8 precludes the provision of a write protect switch. That is, only the leading (front) portions of contact pads C8 and C9 are consistent with corresponding contact pads of the MMC 9-pin form factor and the SD 9-pin form factor, so socket contact pins that access the rear portions would be either be incompatible with these previous form factors, or redundant (if provided in addition to pins that contact the front portions of these contact pads). Further, because the rear portion of contact pad C8 (MMC Specification Version 4.0) coincides with the position of the write protect switch detection apparatus used in SD systems, the inventors note that producing a socket that both supports write protect switch detection and includes a pin positioned to contact the rear section of contact pad C8 would be difficult and impractical. Accordingly, the present inventors determined that eliminating the rear section of contact pads C8 and C9 greatly facilitates the formation of a system that supports both SD and MMC memory cards. Thus, the novel contact pad arrangement of array 120 provides several benefits over previously established 13-pin contact pad arrangements.

Referring to the left side of FIG. 6(A), according to another aspect, thirteenth contact pad 126 is substantially rectangular (approximately 5.4 mm by 1.3 mm), and has a front end that is located between front end R1-F and back end R1-B of first row R1, and a back end that is located between front end R2-F and back end R2-B of second row R2. As mentioned above, the main benefit of thirteenth contact pad 126 over contact pad C9 of MMC Specification Version 4.0 is reduced area. Accordingly, in embodiments where this area reduction is not necessary, the larger, two-part contact pad C9 may be utilized in place of thirteenth contact pad 126.

Referring again to FIG. 6(A), contact pad array 120 is characterized in that the eight contact pads 122-1 through 122-8 of the first group 122 are separated from the four contact pads 124-1 through 124-4 of second group 124 to by an elongated gap 123 (generally indicated by shaded region) that extends between the back ends of contact pads 122-1 through 122-8 and the front ends of 124-1 through 124-4. In particular, the back ends of contact pads 122-1 through 122-8 define back end (first straight) line R1-B of first row R1, and the front ends of contact pads 124-1 through 124-4 define front end (second straight) line R2-F, and elongated gap 123 is defined between back end line R1-B and front end line R2-F. The benefit of this arrangement is the provision that the back end of contact pad 122-8 is in general coincident with the back ends of contact pads 122-1 through 122-7, thereby facilitating the formation of a substantially rectangular alignment notch 128 in longer side edge 112 of PCB 110A in the region behind eighth contact pad 122-8 and to the right side of twelfth contact pad 124-4. In one embodiment, alignment notch 128 includes a front notch edge 128F and an opposing back notch edge 128B that extending substantially parallel to front edge 111 of PCB 110, and a side notch edge 128S that extends parallel to longer side edge 112. Front notch edge 128F is located between back end R1-B of first row R1 and front end R2-F of second row R2, and back notch edge 128B is located behind second row R2. Front notch edge 128F and back notch edge 128B have lengths selected such that at least a portion of eighth contact pad 122-8 is located between an area defined between the lengthwise extension of side notch edge 128S and longer side edge 112A. In one embodiment, front notch edge 128F and back notch edge 128B have lengths selected such that a portion of seventh contact pad 122-7 is located between an area defined between the lengthwise extensions of side notch edge 128S and longer side edge 112A. Note that one or more additional alignment notches may be provided along either side edge 112A and 114A of PCB 110A.

Referring back to FIG. 4, two-part housing 201 is connected together over PCBA 100 such that contact pads 122, 124 and 126 are exposed for coupling to a host system when memory card 200 is inserted into a socket (not shown) of the host system. Upper cover 210 includes a frame formed by linked peripheral walls (e.g., side walls 211-1 and 211-2, and front wall 211-3), several connection structures (e.g., ultrasonic bonding structures) 212 extending downward from a lower edge of at least some of these peripheral walls, and a planar upper wall 214 supported on upper edges of the peripheral walls. Similarly, lower cover 220 includes a frame including side peripheral walls 221-1 and 221-2, front wall 221-3 and back wall 221-4, and a planar lower wall 224 supported on lower edges of these peripheral walls. As described in additional detail below, when connected together in the manner depicted in FIG. 5, peripheral walls 211-1 and 211-2 of upper cover 210 are received inside peripheral walls 221-1 and 221-2 of lower cover 220, and connection structures 212 are melted or otherwise used to secure the two covers together. In an alternative embodiment (not shown) upper cover 210 may include a step-like geometry that extends over peripheral walls 221 of lower cover 220 (which are shorter in height), and the connection structures are located to secure the top edge of peripheral walls 221 to outer peripheral edges of upper cover 210.

According to an aspect of the present invention, housing 201 includes a write protect switch mounting structure 227 for slidably securing a write protect switch 230, and alignment notch 128 receives write protect switch mounting structure 227 when PCBA 100 is mounted inside housing 201. In particular, write protect switch mounting structure 227 includes a substantially rectangular raised wall 228 that extends onto lower wall 224, and a rail portion 229 that extends into a slot 232 of write protect switch 230 when write protect switch 230 is mounted onto lower cover 220. When PCBA 100 is mounted onto lower cover 220 during assembly, the end and side walls of alignment notch 128 tightly fit around raised wall 228, thereby providing self-alignment of PCBA 100 to lower cover 220. Write protect switch structure 230 is then optionally mounted onto write protect switch mounting structure 227 such that rail 229 is received in slot 232 (note that slidable switch structure 230 may be omitted in MMC versions of memory card 200). A corresponding structure (not shown) is provided on upper cover 210, whereby write protect switch 230 is secured to housing 201 when assembled. Thus secured, switch 230 is slidably between the two positions indicated by reference numerals 230-1 and 230-2 in FIG. 5. Accordingly, PCBA 100 and housing 201 can be used to manufacture either SD or MMC memory cards (i.e., by mounting ICs 130 and 135 that execute the corresponding SD or MMC protocol), thereby reducing manufacturing costs by avoiding the need to produce multiple housings and/or PCBAs.

According to another aspect of the invention, housing 201 includes a card detection notch 238 for the socket to detect the readiness of the memory card when it is fully inserted into the socket. A properly located contact spring 342 mounted in slot 314 (in FIG. 1) is constructed similarly to detector 330 consisting of fixed-end base, inclined portion and a hook. As the memory card slides along the slots 312 and 314, the hook portion of contact spring 324 is depressed toward circuit board 301 to make contact with an existing circuit inside the PCB to complete a closed circuit and enables the detection of the memory card.

According to another aspect of the invention, upper wall 214 of upper cover 210 defines at least one window through which at least two contact pads of first row 122 and at least two contact pads of second row 124 are exposed. That is, a window exposing two contact pads of first row 122 and two contact pads of second row 124 provides an efficient mechanism for establishing contact with the two rows of contact pads upon inserting the leading edge of memory card 200 into an associated socket (i.e., in the direction indicated by arrow D in FIG. 5). In the present embodiment, a first window 215-1 exposes contact pads 122-1 through 122-3 of the first row and contact pads 124-1 and 124-2 of the second row. Similarly, a second window 215-2 exposes contact pads 122-5 through 122-8 of the first row and contact pads 124-3 and 124-4 of the second row. In addition, cover 210 defines a third window 125-3 that exposes thirteenth contact pad 126, and a fourth window 215-4 that exposes contact pad 122-4. Note that a central cover section 218 extends from a front edge of upper wall 214 between windows 215-1 and 215-2, and several ribs 216-1 through 216-3 extend between adjacent windows to connect upper wall 214 (and/or central cover section 218) to front wall 211-3, thereby providing a rigid support for upper wall 214, and providing some protection for the various contact pads from contamination. In particular, a first rib 216-1 extends between a front edge of upper wall 214 and a first end of front wall 211-3 between windows 215-1 and 215-3, a second rib 216-2 extends between a front edge of central cover section 218 and front wall 211-3 between windows 215-1 and 215-4, and a third rib 216-3 extends between a front edge of central cover section 218 and front wall 211-3 between windows 215-2 and 215-3.

Figure 7:
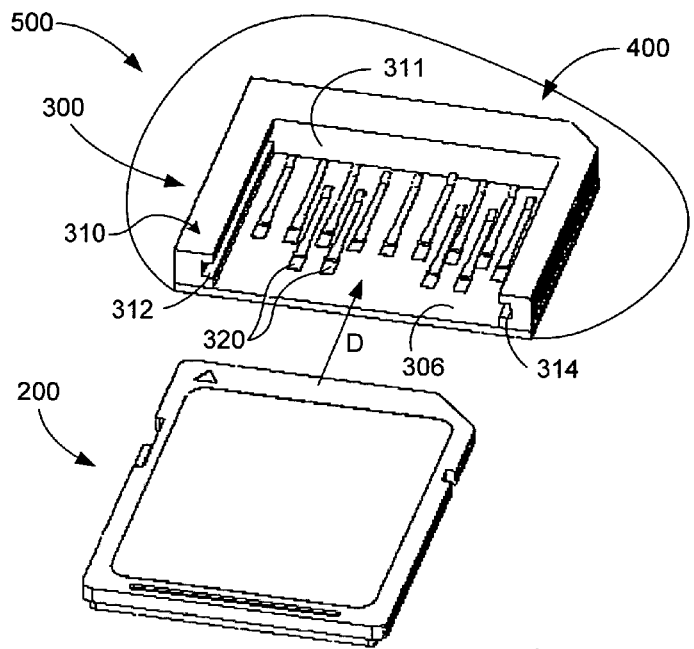
FIG. 7 is an exploded perspective view showing a system including the socket apparatus of FIG. 1 and the combination SD/MMC memory card of FIG. 4 according to another embodiment of the present invention.

FIG. 7 is an exploded perspective view showing a system 500 including socket 300 and combination SD/MMC memory card 200 according to another embodiment of the present invention. Socket 300 is mounted onto a host device 400 (e.g., a digital camera, or any other electronic device utilizing an MMC or SD type memory card), which includes a processor or other circuitry capable of communicating with memory card 200 according to known techniques.

When inserted, the side edges of memory card 200 are slidably engaged into slots 312 and 314 of frame 310, and memory card 200 is pushed forward until its front edge abuts end wall 311 of frame 310. At this point contact springs make contact with contact pads (not shown) of memory card 200, and communication between memory card 200 and a host device 400 is performed (e.g., data is read from memory card 200 to host device 400, or data is written from host device 400 to memory card 200). By utilizing socket 300 and card 200 in the manner described below, system 500 facilitates the inexpensive production of devices utilizing either SD or MMC memory cards.

Figure 8:
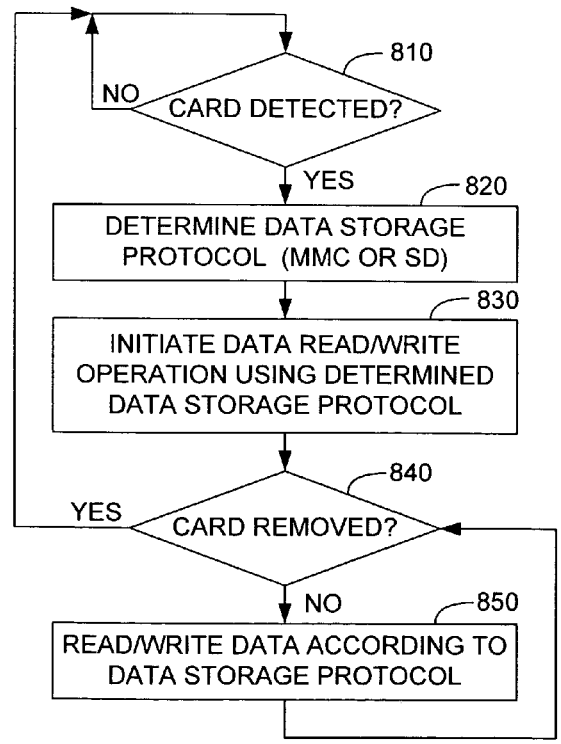
FIG. 8 is a flow diagram depicting a read/write operation performed by the system of FIG. 7 according to another embodiment of the present invention.

FIG. 8 is a flow diagram depicting a read/write operation of system 500 according to a greatly simplified embodiment of the present invention. First, socket 300 detects the presence of memory card 200 (or another MMC or SD card) using known methods (block 810). Upon detecting the presence of the memory card (YES branch from decision block 810), either the host system or a socket-based detection mechanism determines whether the inserted memory card includes an MMC or SD data storage protocol (block 820). This determination may involve reading identification data from the inserted card, or may involve detecting a physical characteristic of the inserted card. Next, the host device then loads and executes a predefined program (e.g., a data read and/or write operation) using the detected data storage protocol (block 830). This program is executed while the inserted card is detected (block 850), and is terminated when the card is removed (YES branch from block 840).

FIGS. 9(A) through 9(D) and 10(A) through 10(D) illustrate the position and operation of contact springs 320 during the insertion of memory card 200.

FIGS. 9(A) through 9(D) are simplified partial top views illustrating the novel arrangement of the spring contacts according to another aspect of the present invention. For clarity, the base and inclined segments of the contact springs are omitted in FIGS. 9(A) through 9(D), and only hooks 322-1 through 322-8, 324-1 through 324-4, and 326 are shown in these figures.

Figure 9A:
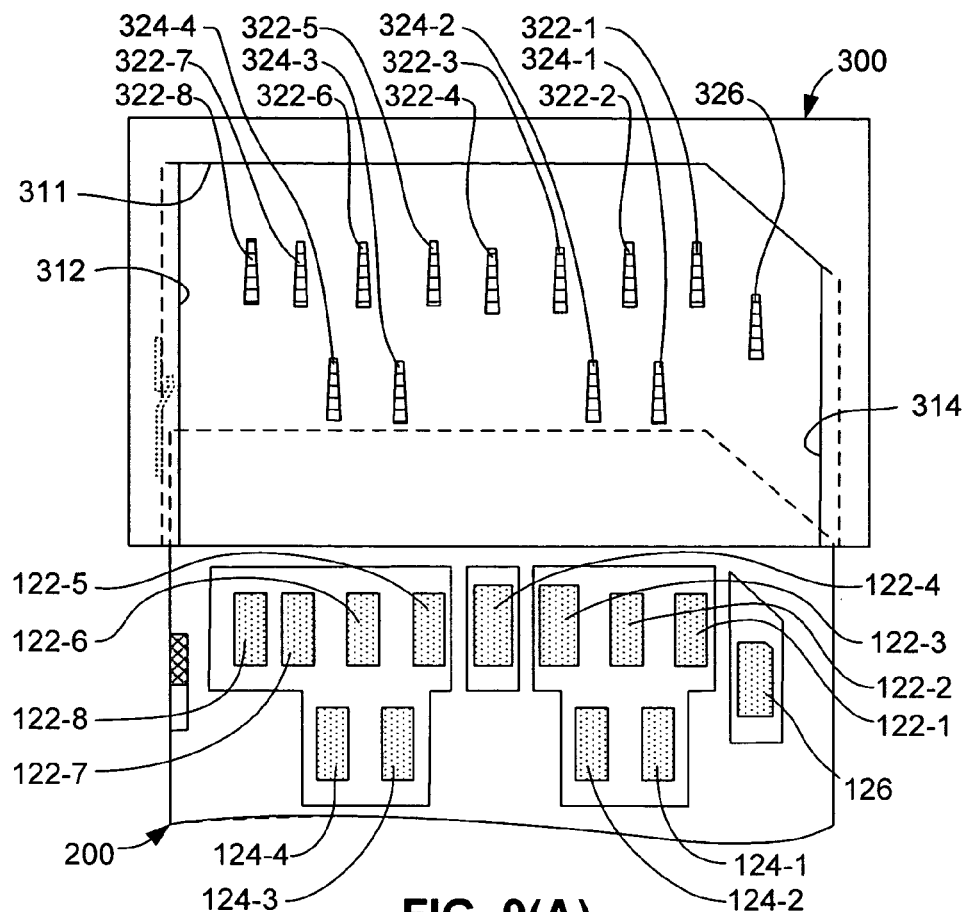
FIGS. 9(A), 9(B), 9(C) and 9(D) are top views showing the combination SD/MMC memory card of FIG. 4 during insertion into the socket apparatus of FIG. 1.

Referring to FIG. 9(A), first row hooks 322-1 through 322-8 are positioned to contact first row contact pads 122-1 through 122-8, respectively, of memory card 200 when memory card 200 is fully inserted into socket 300. Similarly, second row hooks 324-1 to 324-4 are positioned to contact second row contact pads 124-1 through 124-4, respectively, and thirteen hook 326 is positioned to contact thirteen contact pad 126 when memory card 200 is fully inserted into socket 300.

Figure 9B:
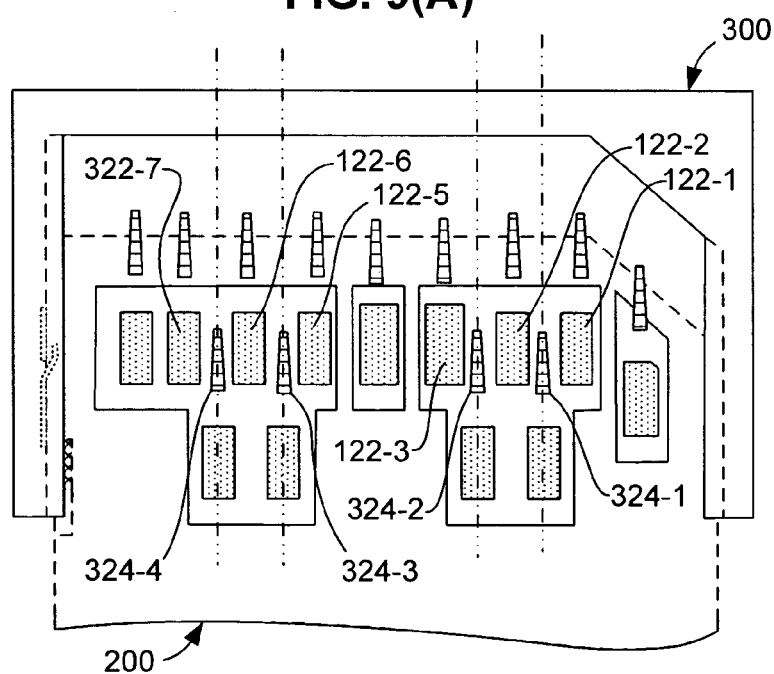

As indicated by the vertical dashed lines provided in FIG. 9(B), second row hooks 324-1 to 324-4 are aligned with electrically insulated regions separating the first row contact pads, and are preferably sized such that they do not touch the adjacent front row contact pads during the insertion process, thereby avoiding erroneous operation and or damage. In particular, hook 324-1 is aligned to slide along an electrically separating contact pads 122-1 and 122-2, hook 324-2 is aligned to slide along an electrically separating contact pads 122-2 and 122-3, hook 324-3 is aligned to slide along an electrically separating contact pads 122-5 and 122-6, and hook 324-4 is aligned to slide along an electrically separating contact pads 122-6 and 122-7.

Figure 9C:
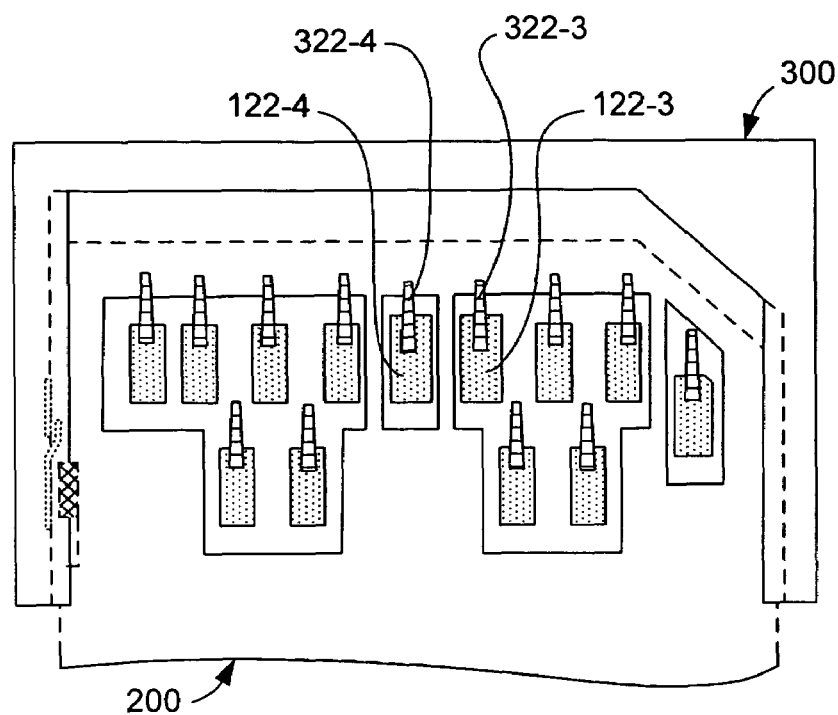

Referring to FIG. 9(C), as memory card 200 is further pushed into socket 300, the first hooks to make contact with associated contact pads are the slightly offset hooks 322-3 and 322-4, which make contact with contact pads 122-3 and 122-4, respectively, slightly before any of the other hooks make contact. Accordingly, power is applied to and/or static electricity is removed from memory card 200 before contact is made with the remaining data signal contact pads.

Figure 9D:
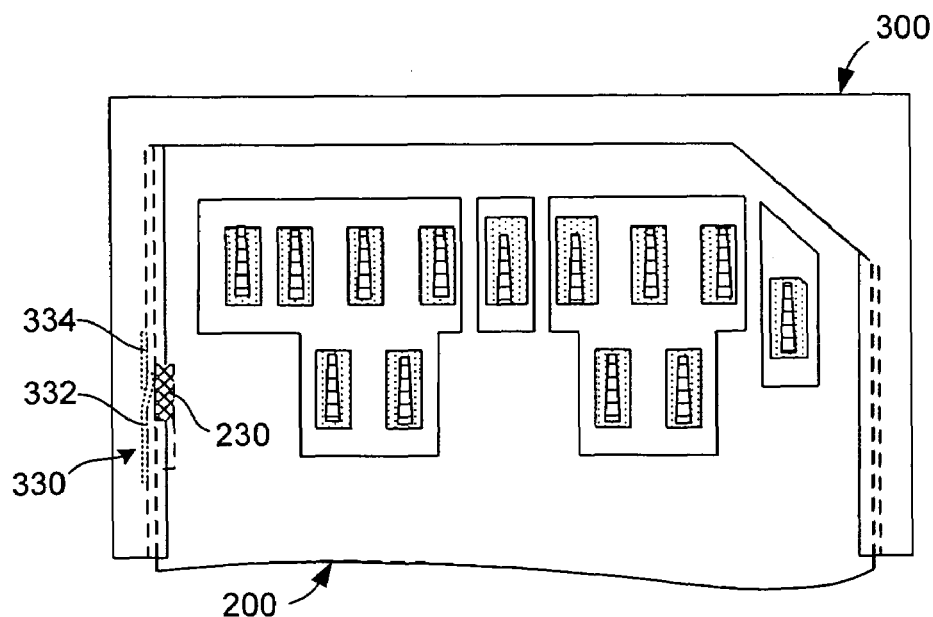

As indicated in FIG. 9(D), when memory card 200 is fully inserted into socket 300, each of the hooks abuts an associated contact pad, thereby facilitating 8-bit communication between the host device and memory card 200 according to the selected data storage protocol. In addition, write-protect detector 330 detects the position of write-protect switch 230, and controls the (e.g., SD-based) data read/write operation based on the position of write-protect switch 230. For example, as indicated in FIG. 9(D), write-protect switch 230 is in the forward position, thereby pressing movable electrode 322 against fixed electrode 324 and generating an appropriate closed-circuit signal. Alternatively, if write-protect switch 230 were in the rearward position, movable electrode 322 would not be pressed against fixed electrode 324, and write-protect detector 330 would generate an open-circuit signal.

Figure 10A:
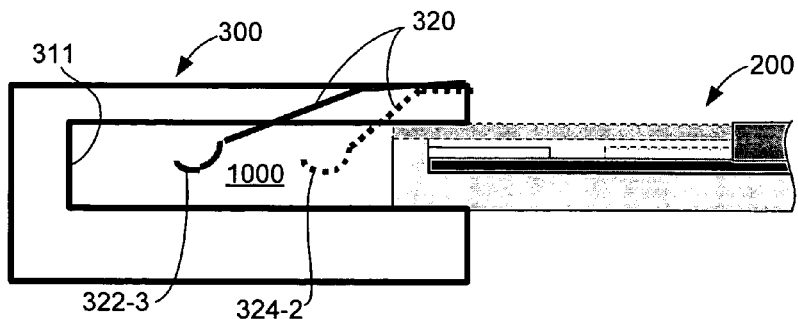
FIGS. 10(A), 10(B), 10(C) and 10(D) are simplified cross-sectional side views showing the combination SD/MMC memory card of FIG. 4 during insertion into the socket apparatus of FIG. 1.
Figure 10B:
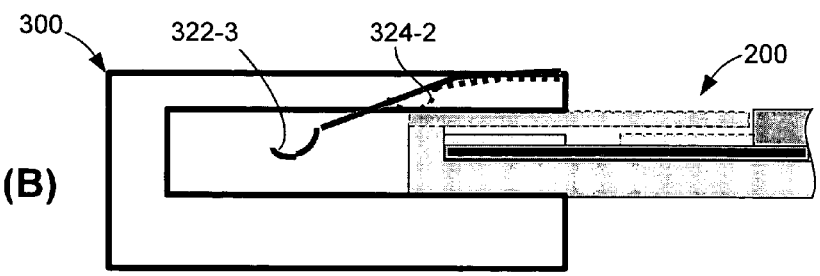
Figure 10C:
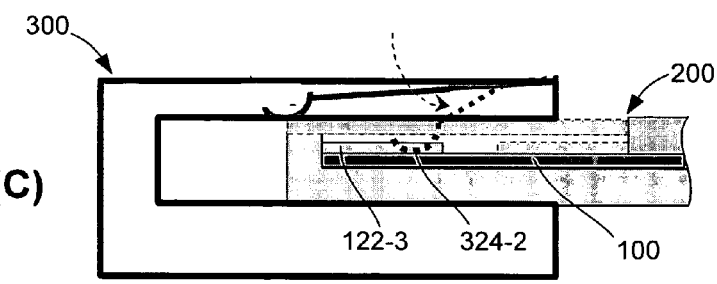
Figure 10D:
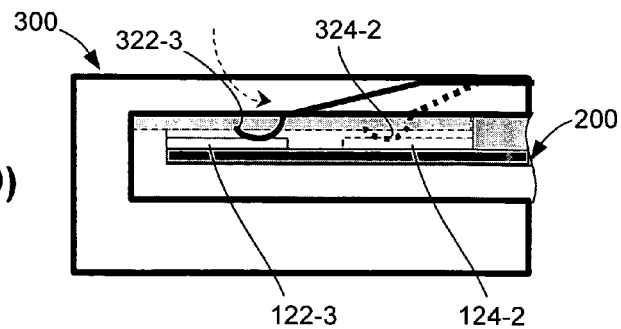

FIGS. 10(A) through 10(D) are partial cross-sectional side views showing the actuation of the contact springs 320 during the insertion process. As indicated in FIG. 10(A), at the initial stage of the insertion process, the front row hooks (e.g., hook 322-3) and the back row hooks (e.g., hook 324-2) extend into the horizontal space 1000 that is defined by front wall 311 and slots 312 and 314 (shown, e.g., in FIG. 1). As indicated in FIG. 10(B), when the leading edge of memory card 200 contacts back row hook 324-2, the associated contact springs are resiliently deflected upward, and hook 322-2 (along with the remaining back row hooks) slides over the front edge of memory card 200. Similarly, as the leading edge of memory card 200 is advanced even further, front row hook 322-3 (along with the remaining front row hooks) makes contact with and is deflected over the front edge of memory card 200. As indicated in FIG. 10(C), when back hook 324-2 clears the front edge of memory card 200, it is resiliently biased against the upper surface of PCBA 100. As discussed above with reference to FIG. 9(B), because of its position relative to the front contact pads, back hook 324-2 slides along the insulated region of the upper surface of PCBA 100 next to contact pad 122-3. Finally, as indicated in FIG. 10(D), when memory card 200 is fully inserted into socket 300, front row hook 322-3 is resiliently biased against front row contact pad 122-3, and back row hook 324-2 slides onto back row contact pad 324-2, thereby completing the coupling process.

According to another aspect of the present invention, the positions of the contact pads of memory card 200 and the positions of the hooks provided on socket 300 are selected such that socket 300 is backward compatible with all currently existing MMC and SD form factors. Note that, in order for socket 300 to accept both MMC and SD cards, and to be backward compatible, the locations of the hooks must be carefully defined such that the hooks both contact the contact pads of all existing form factors (e.g., 7-pad MMC, 13-pad MMC, and 9-pad SD). Geometrically, this positioning requires locating the hooks in regions that are commonly shared by all of these form factors, as well as by combination SD/MMC memory card 200 (discussed above). In addition, the back row hooks should be arranged such that they do not inadvertently contact front row contact pads during the insertion process.

Figure 11:
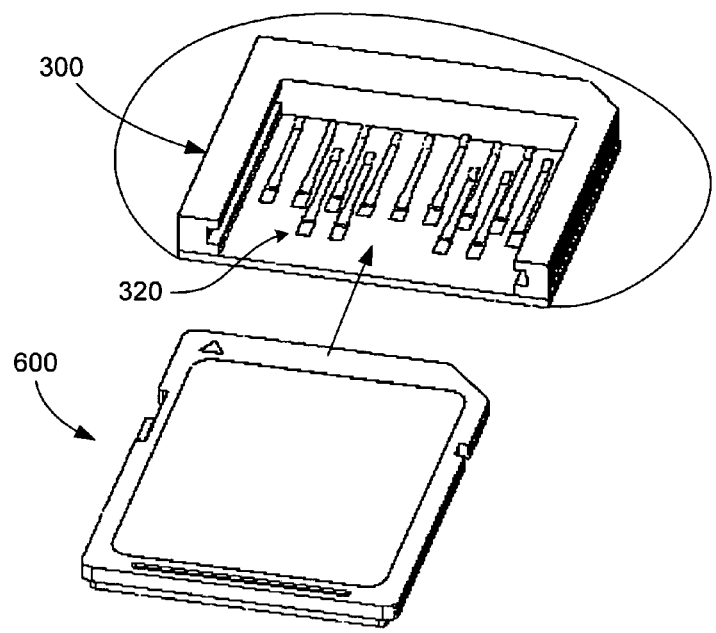
FIG. 11 is an exploded perspective view showing the socket apparatus of FIG. 1 and a conventional SD memory card according to aspect of the present invention.
Figure 12A:
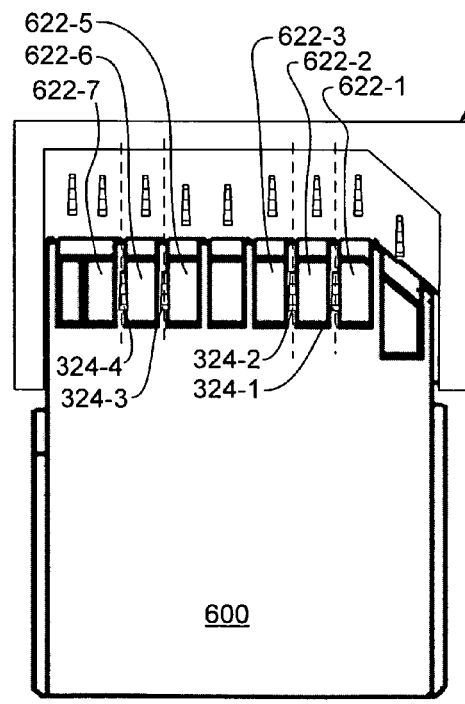
FIGS. 12(A) and 12(B) are top views showing insertion of the conventional SD memory card into the socket of FIG. 1.
Figure 12B:
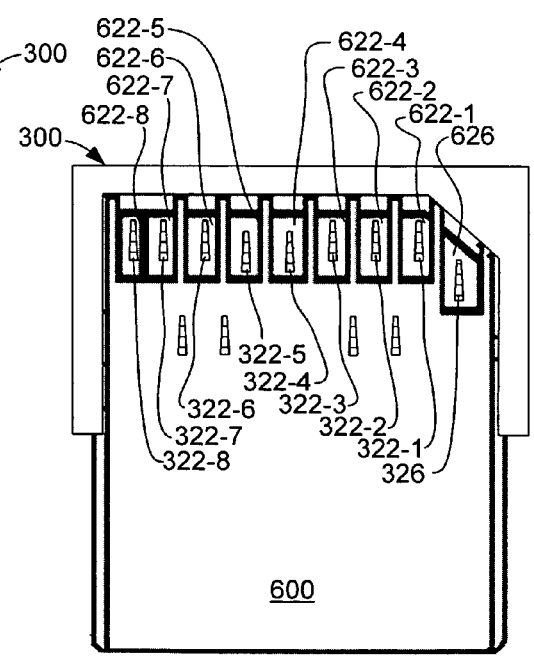

FIG. 11 is an exploded perspective view showing socket 300 and a conventional 9-pin SD memory card 600. According to another aspect of the invention, in addition to being positioned to make contact with the thirteen contact pads of combination SD/MMC memory card 200 (discussed above), contact springs 320 are also arranged to both contact the nine contact pads of conventional 9-pin SD memory card 600, and also such that the back row hooks avoid contacting any of these contact pads during insertion and withdrawal. For example, as depicted by the dashed lines in FIG. 12(A), when SD memory card 600 is inserted into socket 300, rear row hooks 324-1 through 324-4 are aligned to slide along ribs separating adjacent contact pads according to the SD form factor, thereby avoiding contact with the contact pads. In particular, hook 324-1 slides along a raised rib separating contact pads 622-1 and 622-2, hook 324-2 slides along a raised rib separating contact pads 622-2 and 622-3, hook 324-3 slides along a raised rib separating contact pads 622-5 and 622-6, and hook 324-4 slides along a raised rib separating contact pads 622-6 and 622-7. As indicated in FIG. 12(B), when SD memory card 600 is fully inserted, the second row hooks rest against the memory card housing, front row hooks 322-1 through 322-8 make contact with contact pads 622-1 through 622-8, respectively, and hook 326 makes contact with contact pad 626, thereby facilitating 4-bit communication between the host device and SD memory card 600.

Figure 13:
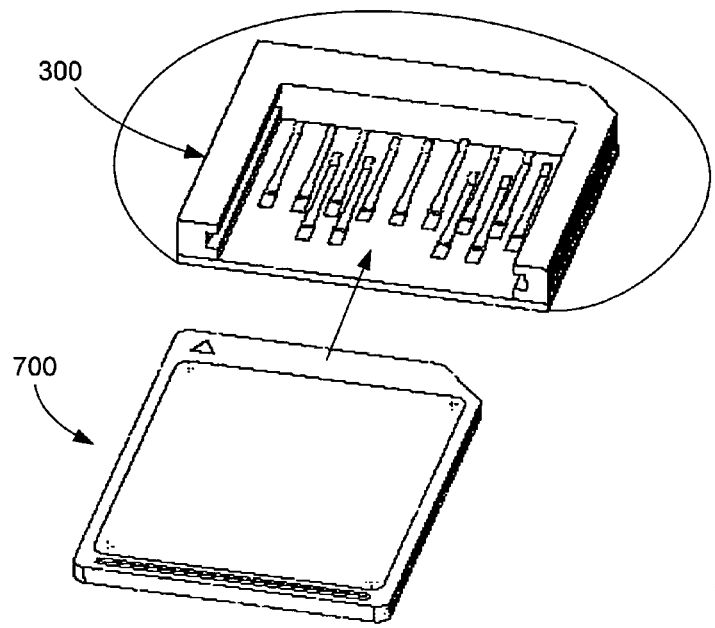
FIG. 13 is an exploded perspective view showing the socket apparatus of FIG. 1 and a conventional MMC memory card according to another aspect of the present invention.
Figure 14A:
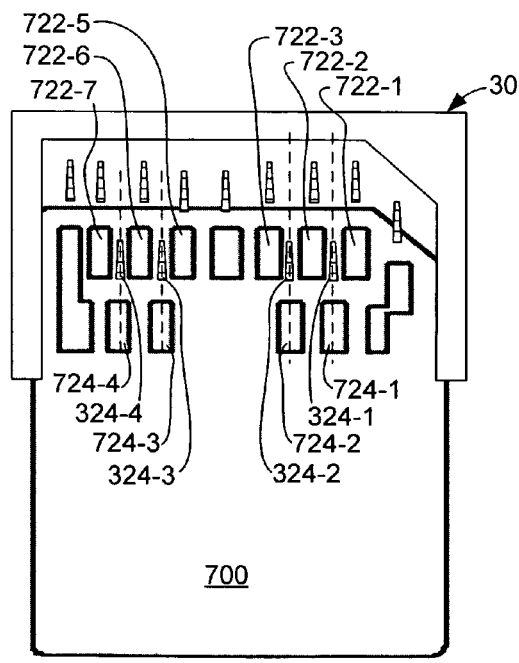
FIGS. 14(A) and 14(B) are top views showing insertion of the conventional MMC memory card into the socket of FIG. 13.
Figure 14B:
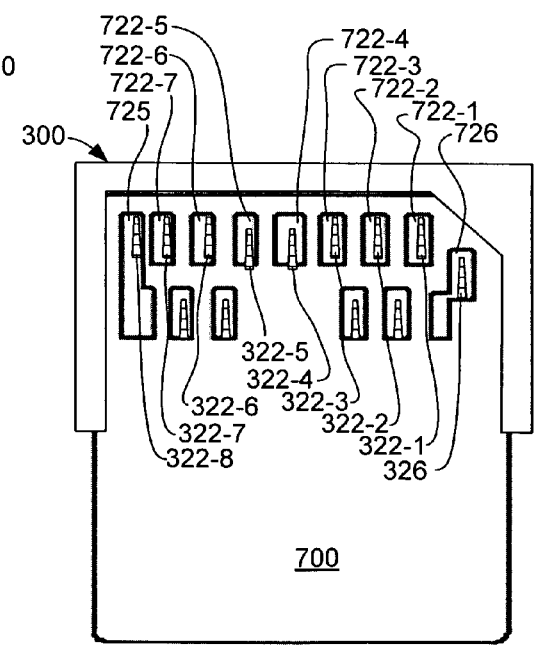

FIG. 13 is an exploded perspective view showing socket 300 and a conventional 13-pad MMC memory card 700 according to the MMC Specification Version 4.0. According to yet another aspect of the invention, contact springs 320 are arranged to both contact the thirteen contact pads of 13-pad MMC memory card 700, and also such that the back row hooks avoid contacting any of the front row contact pads during insertion and withdrawal. For example, as depicted by the dashed lines in FIG. 14(A), when MMC memory card 700 is inserted into socket 300, rear row hooks 324-1 through 324-4 are aligned to slide along insulated sections of the PCB separating adjacent contact pads, thereby avoiding contact with the contact pads. In particular, hook 324-1 slides along a raised rib separating contact pads 722-1 and 722-2, hook 324-2 slides along a raised rib separating contact pads 722-2 and 722-3, hook 324-3 slides along a raised rib separating contact pads 722-5 and 722-6, and hook 324-4 slides along a raised rib separating contact pads 722-6 and 722-7. When MMC memory card 700 is fully inserted, the back row hooks 324-1 through 324-4 contact back row contact pads 724-1 through 724-4 (indicated in FIG. 14(A). In addition, as indicated in FIG. 14(B), front row pins 322-1 through 322-7 make contact with contact pads 722-1 through 722-7, respectively, hook 322-8 makes contact with a forward section of contact pad 725, and hook 326 makes contact with contact pad 726, thereby facilitating 8-bit communication between the host device and MMC memory card 700. Note that the 7-pad MMC memory cards include contact pads that are consistent with front row contact pads 722-1 through 722-7. Therefore, when these conventional MMC cards are inserted into socket 300, the various hooks are in the correct position to make contact with the existing contact pads in a manner similar to that described above.

The various embodiments of the structures and methods of this invention that are described above are illustrative only of the principles of this invention and are not intended to limit the scope of the invention to the particular embodiments described. For example, although the contact springs are disclosed at elongated structures extending toward the end wall of the frame (e.g., toward wall 311, as shown in FIG. 1), in an alternative embodiment the spring structures may be turned 180 degrees, or replaced with suitable contact structures (provided the contact "hooks" are positioned as described above). Thus, the invention is limited only by the following claims and their equivalents.

The invention claimed is:

1. A socket apparatus for receiving and reading a memory card having a front edge, parallel first and second side edges that are perpendicular to the front edge, and a chamfer edge extending between the front edge and the first side edge at a predetermined angle, the memory card also having a plurality of contact pads arranged in at least two rows on a surface thereof, and a write protect switch mounted along the second side edge, wherein the socket apparatus comprises:

a circuit board having a surface;

a frame positioned over the circuit board surface and defining parallel slots for slidably receiving the first and second side edges of the memory card, respectively, the frame also including an end wall positioned to abut the front edge of the memory card when the memory card is fully inserted into the socket apparatus with the contact pads facing the circuit board surface;

a write protect detection structure mounted in the first slot for detecting a position of the write protect switch when the memory card is fully inserted into the socket apparatus; and a plurality of contact springs mounted on the surface of the circuit board, each of the contact springs including a hook biased away from the circuit board surface such that each of the hooks contacts the memory card surface, wherein the plurality of contact springs are arranged such that a first row of hooks are aligned parallel to the front wall of the frame and positioned to contact a first row of contact pads of the memory card when the memory card is fully inserted into the socket apparatus, and a second row of hooks are aligned parallel to the first row and positioned such that the first row is between the second row and the front wall, and such that the second row of hooks contact a second row of contact pads of the memory card when the memory card is fully inserted into the socket apparatus, and wherein the first row comprises eight hooks and the second row comprises four hooks, and the socket apparatus further comprises a thirteenth contact spring having a thirteenth hook positioned between the first and second rows.

2. The socket apparatus of claim 1, wherein the eight hooks of the first row, the four hooks of the second row, and thirteenth hook of the thirteenth contact spring are positioned to operably connect with contact pads of any of a 7-pad MMC card, a 13-pad MMC card, and a 9-pad SD card.

3. The socket apparatus of claim 1, wherein the eight hooks of the first row comprise two offset pins positioned to contact corresponding contact pads of the memory card before the remaining hooks of the first row contact corresponding contact pads while the memory card is being inserted into the socket apparatus.

4. The socket apparatus of claim 1, wherein each of the hooks comprises a base attached to the circuit board surface, an inclined section extending from the base at a predetermined angle relative to the circuit board surface, and an arch having a fixed end connected to the inclined section, wherein each arch is aligned perpendicular to the circuit board surface such that an apex of said each arch is positioned further from the circuit board surface than the fixed end.

5. The socket apparatus of claim 1, wherein the frame further comprises a chamfer wall extending between the front wall and the second slot at the predetermined angle such that the chamfer edge of the memory card abuts the chamfer wall of the frame when the memory card is fully inserted in the socket apparatus.

6. The socket apparatus of claim 5,
wherein the memory card further comprises a thirteenth contact pad located adjacent to the chamfer edge, and
wherein the plurality of contact springs further comprise a thirteenth contact spring having a thirteenth hook positioned to contact the thirteenth contact pad.

7. The socket according to claim 1, wherein the back second row of contact springs are positioned such that the second row of hooks slide between adjacent contact pads associated with a front row of the memory card when the memory card is inserted into the socket apparatus.

8. The socket according to claim 1, wherein the back second row of contact springs are positioned such that the second row of hooks are aligned with and slide on ribs separating adjacent contact pads when an SD-type memory card is inserted into the socket apparatus.

9. A 13-pin socket apparatus for receiving and reading a memory card having a front edge, parallel first and second side edges that are perpendicular to the front edge, and a chamfer edge extending between the front edge and the first side edge, the memory card also having a plurality of contact pads formed on a surface thereof, wherein the socket apparatus comprises:
a circuit board having a surface;
a frame positioned over the surface of the circuit board and defining parallel slots for respectively slidably receiving the first and second side edges of the memory card, and an end wall positioned to abut the front edge of the memory card when the memory card is fully inserted into the socket apparatus with the contact pads facing the circuit board surface; and
a plurality of contact springs mounted on the surface of the circuit board, each of the contact springs including a hook resiliently biased away from the circuit board surface, wherein the plurality of contact springs include:
a first row of eight hooks aligned parallel to the front wall of the frame,
a second row of four hooks aligned parallel to the first row and positioned such that the first row is between the second row and the front wall, and
a thirteenth contact spring having a thirteenth hook positioned between the first and second rows.

10. The socket apparatus of claim 9, wherein the eight hooks of the first row, the four hooks of the second row, and thirteenth hook of the thirteenth contact spring are positioned to operably connect with contact pads of any of a 7-pad MMC card, a 13-pad MMC card, and a 9-pad SD card.

11. The socket apparatus of claim 9,
wherein the frame further comprises a chamfer wall extending between the front wall and the second slot at the predetermined angle such that the chamfer edge of the memory card abuts the chamfer wall of the frame when the memory card is fully inserted in the socket apparatus, and
wherein the thirteen hook is located adjacent to the chamfer wall.

12. The socket apparatus of claim 9, wherein the eight hooks of the first row comprise two offset pins positioned to contact corresponding contact pads of the memory card before the remaining hooks of the first row contact corresponding contact pads while the memory card is being inserted into the socket apparatus.

13. The socket apparatus of claim 9, wherein each of the hooks comprises a base attached to the circuit board surface, an inclined section extending from the base at a predetermined angle relative to the circuit board surface, and an arch having a fixed end connected to the inclined section, wherein each arch is aligned perpendicular to the circuit board surface such that an apex of said each arch is positioned further from the circuit board surface than the fixed end.

14. The socket according to claim 9, wherein the back second row of contact springs are positioned such that the second row of hooks slide between adjacent contact pads associated with a front row of the memory card when the memory card is inserted into the socket apparatus.

15. The socket according to claim 9, wherein the back second row of contact springs are positioned such that the second row of hooks are aligned with and slide on ribs separating adjacent contact pads when an SD-type memory card is inserted into the socket apparatus.

16. A data storage system comprising:
a memory card including:
a printed circuit board (PCB) including a front edge, a relatively long side edge, a relatively short side edge located opposite to the relatively long side edge, and a chamfer edge extending between front edge and the relatively short side edge;
a plurality of contact pads formed on a first surface of the PCB, the plurality of contact pads including a first row of contact pads and a second row of contact pads, the first row being aligned along the front edge of the PCB, and the second row being aligned parallel to the first row and positioned such that the first row is between the second row and the front end of the PCB; and
a two-part housing including:
an upper cover including an upper wall mounted over the upper surface of the PCB; and
a lower cover including a lower wall mounted over a bottom surface of the PCB, the lower cover being attached to the upper cover,
wherein the lower cover includes a switch mounting structure, and
wherein the relative long side edge of the PCB defines an alignment notch that receives the switch mounting structure when the PCB is mounted onto the two-part housing; and
a socket apparatus for receiving and reading the memory card, the socket apparatus including:
a circuit board having a surface;
a frame positioned over the circuit board surface and defining parallel slots for slidably receiving the first and second side edges of the memory card, respectively, the frame also including an end wall positioned to abut the front edge of the memory card when the memory card is fully inserted into the socket apparatus with the contact pads facing the circuit board surface;
a plurality of contact springs mounted on the surface of the circuit board, each of the contact springs including a hook biased away from the circuit board surface such that each of the hooks contacts the memory card surface,
wherein the plurality of contact springs are arranged such that a first row of hooks are aligned parallel to the front wall of the frame and positioned to contact the first row of contact pads of the memory card when the memory card is fully inserted into the socket apparatus, and a second row of hooks are aligned parallel to the first row and positioned such that the first row of hooks is between the second row of hooks and the front wall, and such that the second row of hooks contact the second row of contact pads of the memory card when the memory card is fully inserted into the socket apparatus, wherein the first row of contact pads includes eight substantially rectangular contact pads, each contact pad of the first row having a front end located adjacent to the front edge of the PCB, each contact pad of the first row also having a back end, the first row including a first contact pad located at a first end of the first row adjacent to the chamfer edge, and an eighth contact pad located at a second end of the first row adjacent to the relatively long side edge, and wherein the second row of contact pads includes four substantially rectangular contact pads arranged parallel to the first row, each contact pad of the second row having a front end and a back end, the second row including a ninth contact pad located at a first end of the second row adjacent to the chamfer edge, and a twelfth contact pad located at a second end of the first row adjacent to the relatively long side edge.

17. The system according to claim 16, wherein the back ends of each contact pad of the first row define a first straight line, wherein the front ends of each contact pad of the second row define a second straight line that is parallel to the first straight line, and wherein an elongated gap is defined between the first and second straight lines.

18. The system according to claim 16, wherein the first row of hooks comprises eight hooks positioned to contact the eight contact pads of the first row of contact pads, and the second row of hooks comprises four hooks positioned to contact the four contact pads of the second row of contact pads.

19. The system according to claim 18, wherein the eight hooks of the first row comprise two offset pins positioned to contact corresponding contact pads of the memory card before the remaining hooks of the first row contact corresponding contact pads while the memory card is being inserted into the socket apparatus.

20. The system according to claim 18, wherein the memory card further comprises a thirteenth contact pad located adjacent to the chamfer edge, and wherein the socket apparatus further comprises a thirteenth contact spring having a thirteenth hook positioned to contact the thirteenth contact pad.

21. The system according to claim 20, wherein the eight hooks of the first row, the four hooks of the second row, and thirteenth hook of the thirteenth contact spring are positioned to operably connect with contact pads of any of a 7-pad MMC card, a 13-pad MMC card, and a 9-pad SD card.

* * * * *